US012660599B2

(12) United States Patent
Li et al.

(10) Patent No.: US 12,660,599 B2
(45) Date of Patent: Jun. 16, 2026

(54) HYBRID SIGNAL AND POWER TRACK FOR STACKED TRANSISTORS

(71) Applicant: International Business Machines Corporation, Armonk, NY (US)

(72) Inventors: Tao Li, Slingerlands, NY (US); Kisik Choi, Watervliet, NY (US); Albert M. Young, Fishkill, NY (US); Julien Frougier, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 599 days.

(21) Appl. No.: 17/806,602

(22) Filed: Jun. 13, 2022

(65) Prior Publication Data

US 2023/0402379 A1 Dec. 14, 2023

(51) Int. Cl.
*G11C 5/05* (2006.01)
*H10W 20/20* (2026.01)
*H10W 20/41* (2026.01)
*H10W 90/00* (2026.01)
*H10W 90/20* (2026.01)

(52) U.S. Cl.
CPC ......... *H10W 20/427* (2026.01); *H10W 20/20* (2026.01); *H10W 90/00* (2026.01); *H10W 90/297* (2026.01)

(58) Field of Classification Search
CPC .............. H01L 23/5286; H01L 23/481; H01L 25/0657; H01L 2225/06541
USPC ......................................................... 365/63
See application file for complete search history.

(56) References Cited

U.S. PATENT DOCUMENTS

| | | | |
|---|---|---|---|
| 8,450,149 B2 | 5/2013 | Bayan et al. | |
| 9,449,898 B2 * | 9/2016 | Lin | H01L 21/76841 |
| 10,192,819 B1 | 1/2019 | Chanemougame et al. | |
| 10,192,867 B1 | 1/2019 | Frougier et al. | |
| 10,510,622 B1 | 12/2019 | Frougier et al. | |
| 10,607,938 B1 * | 3/2020 | Rubin | H10D 86/011 |
| 11,158,580 B2 * | 10/2021 | Sio | H01L 23/5385 |
| 11,195,930 B1 | 12/2021 | Chen et al. | |
| 12,424,549 B2 * | 9/2025 | Lanzillo | H01L 23/535 |

(Continued)

FOREIGN PATENT DOCUMENTS

| | | |
|---|---|---|
| CN | 113424307 A | 9/2021 |
| DE | 102020103710 A1 | 9/2020 |

OTHER PUBLICATIONS

Ryckaert et al., "The Complementary FET (CFET) for CMOS scaling beyond N3," Symposium on VLSI Technology, 2018, pp. 141-142.

*Primary Examiner* — Viet Q Nguyen
(74) *Attorney, Agent, or Firm* — Daniel M. Yeates

(57) ABSTRACT

Provided is a semiconductor device. The semiconductor device comprises a first transistor stacked above a second transistor. The semiconductor device further includes a frontside power rail that is electrically coupled to a source/drain epitaxy of the first transistor. The semiconductor device further includes a backside power rail that is electrically coupled to a source/drain epitaxy of the second transistor. The semiconductor device further includes a plurality of frontside signal lines. The plurality of signal lines includes a first frontside signal line that is electrically coupled to a source/drain epitaxy of the second transistor. The frontside signal line is connected to the source/drain epitaxy through a backside contact and an interlevel via.

18 Claims, 15 Drawing Sheets

(56)          References Cited

U.S. PATENT DOCUMENTS

| | | | |
|---|---|---|---|
| 2012/0292797 A1* | 11/2012 | Curatolo | A61K 9/1652 |
| | | | 264/12 |
| 2019/0259702 A1* | 8/2019 | Jain | H01L 23/5286 |
| 2020/0098921 A1 | 3/2020 | Rachmady et al. | |
| 2020/0266169 A1 | 8/2020 | Kang et al. | |
| 2020/0294998 A1 | 9/2020 | Lilak et al. | |
| 2020/0328121 A1* | 10/2020 | Yao | H10D 84/013 |
| 2021/0074823 A1 | 3/2021 | Glass et al. | |
| 2021/0351079 A1* | 11/2021 | Su | H10D 84/0128 |
| 2021/0376071 A1* | 12/2021 | Liu | H10D 30/6757 |
| 2021/0407999 A1 | 12/2021 | Huang et al. | |
| 2022/0320299 A1* | 10/2022 | Chen | H01L 24/73 |
| 2022/0352179 A1* | 11/2022 | Yang | H10B 10/12 |
| 2022/0367284 A1* | 11/2022 | Chen | H10D 84/0151 |
| 2023/0187551 A1* | 6/2023 | Cheng | H10D 30/6757 |
| | | | 257/369 |
| 2023/0307364 A1* | 9/2023 | Park | H01L 21/7806 |
| 2023/0352406 A1* | 11/2023 | Li | H01L 23/5286 |
| 2023/0369218 A1* | 11/2023 | Li | H10D 30/6757 |
| 2023/0420367 A1 | 12/2023 | Xie et al. | |
| 2024/0006483 A1* | 1/2024 | Sharma | H10D 30/6211 |
| 2024/0079294 A1* | 3/2024 | Li | H10D 84/0149 |
| 2024/0162308 A1* | 5/2024 | Shen | H10D 62/121 |
| 2024/0203879 A1* | 6/2024 | Xie | H01L 21/76897 |
| 2024/0222378 A1* | 7/2024 | Li | H10D 86/00 |

* cited by examiner

HYBRID SIGNAL AND POWER TRACK FOR STACKED TRANSISTORS

BACKGROUND

The present invention relates in general to semiconductor fabrication methods and resulting structures. More specifically, the present invention relates to hybrid signal and power tracks for stacked field-effect transistors (FETs) and methods of forming the same.

A stacked FET is a transistor architecture where the idea is to stack both n-type FETs (nFET) and p-type FETs (pFET) on each other. A stacked FET can stack one nFET on top of a pFET transistor, or one pFET on top of a nFET transistor, or one nFET over anther nFET, or one pFET over another pFET. Since a stacked FET stacks two devices on each other, the transistor provides benefits related to area.

SUMMARY

Embodiments of the present invention include fabrication methods and the corresponding structures. Some embodiments of the present disclosure include a semiconductor device. The semiconductor device comprises a first transistor stacked above a second transistor. The semiconductor device further includes a frontside power rail that is electrically coupled to a source/drain epitaxy of the first transistor. The semiconductor device further includes a backside power rail that is electrically coupled to a source/drain epitaxy of the second transistor. The semiconductor device further includes a plurality of frontside signal lines. The plurality of signal lines includes a first frontside signal line that is electrically coupled to a source/drain epitaxy of the second transistor. The first frontside signal line is connected to the source/drain epitaxy through a backside contact and an interlevel via. In some embodiments, the plurality of signal lines also includes a second frontside signal line that is electrically coupled to a source/drain epitaxy of the first transistor.

Further embodiments of the present disclosure include a semiconductor device. The semiconductor device includes a stacked transistor. The stacked transistor includes a bottom transistor having one or more bottom source/drain epitaxy regions and a top transistor having one or more top source/drain epitaxy regions. A bottom source/drain epitaxy region is connected to a first frontside signal line though an interlevel via. The interlevel via is located between cell boundaries of the stacked transistor and an adjacent device.

Additional embodiments of the present disclosure include a fabrication method, system, and computer program product. The fabrication method comprises forming a stacked FET. The stacked FET includes a top transistor with at least two top source/drain epitaxy regions and a bottom transistor with at least two bottom source/drain epitaxy regions. The method further comprises forming one or more middle-of-line (MOL) structures. The method further comprises forming one or more frontside contacts and frontside vias. The one or more frontside contacts and frontside vias wire a first top source/drain epitaxy to a frontside power rail and a second top source/drain epitaxy to a signal line. The method further comprises forming one or more BEOL layers. The method further comprises forming one or more backside contacts below the bottom source/drain epitaxies. At least one formed backside contact connects a bottom source/drain epitaxy to a first MOL structure, and at least one backside contact connects a bottom source/drain epitaxy to a backside power rail through a backside via.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
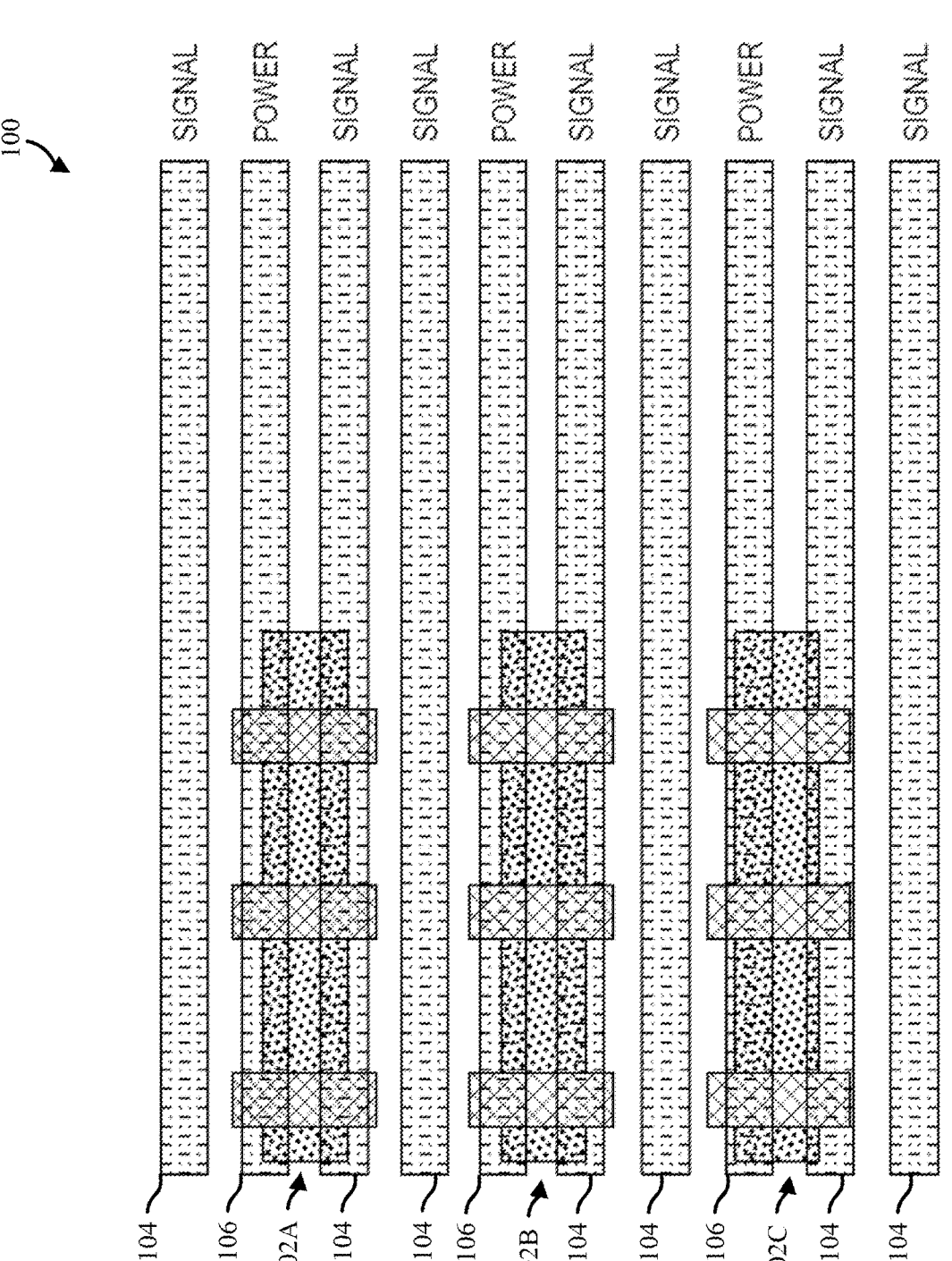
FIG. 1 depicts a plan view of an example high level layout of stacked transistors and corresponding signal and power lines, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to semiconductor fabrication methods and resulting structures, and more particularly to hybrid signal and power tracks for stacked field-effect transistors (FETs) and methods of making the same. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects in any and all possible combinations as described in the specification and the claims.

The terms "about," "substantially," "approximately," "slightly less than," and variations thereof, are intended to include the degree of error associated with the fabrication or measurement equipment available. For example, "about" can include a range of ±8% or 5%, or 2% of a given value.

For purposes of the description hereinafter, when a first surface is referred to as being arranged "opposite" to a second surface, the first surface is different from the second surface, and the first surface is spaced apart from the second surface. For instances in which the surfaces are substantially planar, the first surface is substantially parallel to the second surface.

It is to be understood that as used herein, "an embodiment" means one or more embodiments that may, or may not, share a common aspect. For example, "a first embodiment" may include one or more embodiments that are related in that they all share a first common aspect, function, and/or feature. Likewise, "a second embodiment" may include one or more embodiments that are related in that they all share a second common aspect, function, and/or feature. Furthermore, a particular embodiment that has both the first common aspect, function, and/or feature and the second common aspect, function, and/or feature may be considered to be both a first embodiment and a second embodiment.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, an integrated circuit (IC) is a set of electronic circuits on one small flat piece (or "chip") of semiconductor material. More specifically, large numbers of tiny transistors can be integrated into a small chip, and interconnects can be used to connect two or more circuit elements (such as transistors) on the chip together electrically. Interconnects can also be used to provide power to the transistors through a power distribution network (PDN) that utilizes buried power rails and via-to-buried power rails (VBPRs). This results in circuits that are orders of magnitude smaller, faster, and less expensive than those constructed of discrete electronic components.

The field-effect transistor (FET) is a type of transistor that uses an electric field to control the flow of current in a semiconductor. FETs are devices with three terminals: a source, a gate, and a drain. FETs control the flow of current by the application of a voltage to the gate, which in turn alters the conductivity between the drain and source. More specifically, the FET controls the flow of electrons (or holes) from the source to drain by affecting the size and shape of a conductive channel created and influenced by voltage (or lack of voltage) applied across the gate and source terminals. (For simplicity, this discussion assumes that the body and source are connected.) This conductive channel is the stream through which electrons flow from source to drain.

FETs are also known as unipolar transistors since they involve single-carrier-type operation. In other words, a FET uses either electrons or holes as charge carriers in its operation, but not both. The source/drain of a FET is doped to produce either an n-type semiconductor (in which case the FET can be referred to as an NFET) or a p-type semiconductor (in which case the FET can be referred to as a PFET). When the voltage applied to the gate of the FET is larger than the threshold voltage, the charge carriers in the channel region of the FET are built up, which activates the FET (e.g., allowing current to flow between the source and the drain).

Many different types of field effect transistors exist. A gate-all-around (GAA) FET is a non-planar (3D) transistor designed such that the gate material surrounds the channel region on all sides. Accordingly, the contact between the gate and the channel is increased, which provides better electrical control over the channel. A GAAFET can be a PFET or an NFET. A gate-all-around n-type semiconductor may also be referred to herein as a GAA NFET. Similarly, a gate-all-around p-type semiconductor may also be referred to herein as a GAA PFET.

A nanosheet transistor is a type of GAA transistor in which one or more sheets of semiconductor material (e.g., Si) are used to create the transistor channels which are surrounded by the gate. As such, the gate is able to surround each sheet on all sides, thereby increasing the contact between the gate and the channel. Furthermore, the more nanosheets used by a transistor, the more contact surface area the gate has with the channel. This provides excellent control of current leakage within the transistor. Nanosheet transistors may be vertically aligned, with a bottom source/drain disposed below the nanosheets (e.g., between the nanosheets and the substrate) and a top source/drain disposed on the top of the nanosheets (opposite the bottom source/drain), or they may be horizontally aligned (e.g., a horizontal-transport GAAFET), where the current travels from the source to the drain in a horizontal direction.

A complementary field-effect transistor (CFET) utilizes GAAFETs vertically stacked on top of one another to reduce the amount of space required to accommodate multiple transistors. In particular, in a CFET, GAAFETs of opposite polarity are vertically stacked on top of one another. For example, a GAA PFET can be vertically stacked on top of an GAA NFET, or a GAA NFET can be vertically stacked on top of a GAA PFET. Once stacked, a pair including a GAA PFET and an GAA NFET can be functionally interconnected and utilized as a complementary metal-oxide-semiconductor (CMOS) cell. In a CMOS cell, complementary pairs of PFETs and NFETs are used for logic functions.

One benefit of stacked FET technologies/architectures (e.g., CFETs) is that stacking transistors can permit smaller scale devices. Additionally, the use of backside power distribution networks (BSPDNs) and backside power rails (BPRs) to provide power to the stacked FETs can greatly improve the routability of the power delivery, which can reduce congestion and enable even smaller scale devices.

However, interconnecting stacked transistors that utilize BSPDNs with frontside power and signal wiring remains a critical issue to be solved.

Embodiments of the present disclosure may overcome these and other drawbacks of existing solutions and provide an architecture for wiring frontside signal lines to bottom transistors of a stacked transistor. Embodiments of the present disclosure include a semiconductor device having a first transistor stacked above a second transistor. The semiconductor device further includes a frontside power rail that is electrically coupled to a source/drain epitaxy of the first transistor. The semiconductor device further includes a backside power rail that is electrically coupled to a source/ drain epitaxy of the second transistor. The semiconductor device further includes a plurality of frontside signal lines. The plurality of signal lines includes a first frontside signal line that is electrically coupled to a source/drain epitaxy of the second transistor. The first frontside signal line is connected to the source/drain epitaxy through a backside contact and an interlevel via. The plurality of signal lines also includes a second frontside signal line that is electrically coupled to a source/drain epitaxy of the first transistor.

In some embodiments, the interlevel via is located between cell boundaries of horizontally adjacent transistors. For example, in some embodiments, the semiconductor device comprises a plurality of (e.g., an array of) stacked transistors. Accordingly, the stacked transistors may be arranged such that they have horizontally adjacent (e.g., in the same plane/level) transistors next to them. The interlevel via for a particular stacked transistor may be located in the region between the particular stacked transistor and a neighboring transistor.

In some embodiments, the semiconductor device further comprises a middle-of-line (MOL) structure and one or more MOL contacts. The one or more MOL contacts may connect the stacked transistor to the MOL structure. In these embodiments, the interlevel via may be patterned from the frontside of the wafer, much like the MOL contacts. Accordingly, the interlevel via may be patterned and fabricated such that is has the same taper angle as the MOL contacts.

In some embodiments, the first frontside signal line is connected to the source/drain epitaxy of the second transistor through a frontside via. In particular, the frontside via may connect the first frontside signal line to the interlevel via. Opposite the frontline via, the interlevel via may be further connected to a backside contact. The backside contact may also be connected to the source/drain epitaxy of the second transistor. Accordingly, the semiconductor device may be configured such that a signal propagates from the first frontside signal line, through the frontside via, through the interlevel via, through the backside contact, and to the source/drain epitaxy of the second transistor.

In some embodiments, the semiconductor device includes a second frontside signal line. The second frontside signal line is connected to a source/drain epitaxy of the first transistor through a frontside contact and frontside via. In particular, the second frontside signal line may be connected to a frontside via. The frontside via may be further connected to a frontside contact oppose the frontside signal line. The frontside contact may be further connected to the source/ drain epitaxy of the first transistor. Accordingly, the semiconductor device may be configured such that a signal propagates from the second frontside signal line, through the frontside via, through the frontside contact, and to the source/drain epitaxy of the first transistor.

In some embodiments, the frontside power rail is connected to the source/drain epitaxy of the first transistor through a frontside via. In particular, the frontside power rail line may be connected to a frontside via. The frontside via may be further connected to the source/drain epitaxy of the first transistor. Accordingly, the semiconductor device may be configured such that power propagates from the frontside power rail, through the frontside via, and into the source/ drain epitaxy of the first transistor.

In some embodiments, the backside power rail is connected to the source/drain epitaxy of the second transistor through a backside via. In particular, the backside power rail line may be connected to a backside via. The backside via may be further connected to the source/drain epitaxy of the second transistor. Accordingly, the semiconductor device may be configured such that power propagates from the backside power rail, through the backside via, and into the source/drain epitaxy of the second transistor.

Embodiments of the present disclosure further include a semiconductor device. The semiconductor device includes a stacked transistor. The stacked transistor includes a bottom transistor having one or more bottom source/drain epitaxy regions and a top transistor having one or more top source/ drain epitaxy regions. A bottom source/drain epitaxy region is connected to a first frontside signal line though an interlevel via. The interlevel via is located between cell boundaries of the stacked transistor and an adjacent device.

In some embodiments, the adjacent device is an adjacent stacked transistor. In other embodiments, the adjacent device may be a different semiconductor device, such as a different kind of transistor.

In some embodiments, the interlevel via is connected to the bottom source/drain epitaxy region through a backside contact. The interlevel via may also be connected to the first signal line through a frontside via. Accordingly, in some embodiments, a signal propagates from the signal line, through the frontside via, through the backside contact, and into the bottom source/drain epitaxy region.

In some embodiments, the semiconductor device further includes a backside power distribution network (BSPDN). The BSPDN may be located below the bottom transistor. The semiconductor device may further include a backside power rail electrically that is connected to the BSPDN. The backside power rail may be located between the BSPDN and the bottom transistor. A bottom source/drain epitaxy region of the bottom transistor may be connected to the backside power rail through a backside via and a backside contact. Additionally, the backside contact may connect the backside via to the backside power rail. Accordingly, power may be delivered from the BSPDN, through the backside power rail, through the backside via, and through the backside contact in order to reach the bottom transistor.

Embodiments of the present disclosure further include a method of manufacturing a semiconductor device. The method comprises forming a stacked FET. The stacked FET includes a top transistor with at least two top source/drain epitaxy regions and a bottom transistor with at least two bottom source/drain epitaxy regions. The method further comprises forming one or more middle-of-line (MOL) structures. The method further comprises forming one or more frontside contacts and frontside vias. The one or more frontside contacts and frontside vias wire a first top source/ drain epitaxy to a frontside power rail and a second top source/drain epitaxy to a signal line. The method further comprises forming one or more BEOL layers. The method further comprises forming one or more backside contacts below the bottom source/drain epitaxies. At least one formed backside contact connects a bottom source/drain epitaxy to a first MOL structure, and at least one backside contact connects a bottom source/drain epitaxy to a backside power rail through a backside via.

Turning now to the figures, shown is a plan view of an example high level layout of a semiconductor device 100 having stacked transistors and corresponding signal and power lines, in accordance with embodiments of the present disclosure. In particular, as shown in FIG. 1, three stacked transistor cells 102A-C (collectively and individually referred to transistor cell(s) 102) are arranged adjacent to each other. Additionally, a plurality of signal lines 104 and power lines 106 run in parallel to each other across the semiconductor device 100. Each transistor cell 102 is below (and connects to) at least one power line 106 and at least one signal line 104.

Figure 2:
FIG. 2 depicts a plan view of an example semiconductor device indicating a Y cross-section location and an X cross-section location for the following figures, in accordance with embodiments of the present disclosure.

Referring now to FIG. 2, depicted is a plan view of the example semiconductor device 100 indicating a Y cross-section location and an X cross-section location for the following figures, in accordance with embodiments of the present disclosure. The semiconductor device 100 includes a first transistor cell 102A, a second transistor cell 102B, and a third transistor cell 102C. Each of the transistor cells 102 includes one or more stacked transistors, with each stacked transistor having a first transistor stacked on top of a second transistor. Each transistor cell 102 includes one or more nanosheets 202 and one or more gates 204, which collectively create stacked nanosheet transistors.

FIG. 2 also shows the location of the cross-sectional cuts that are illustrated in FIGS. 3A-3M. Cut Y runs across the nanosheet transistors in the source/drain epitaxy region, and cut X runs along a length of a single nanosheet 202 and crosses three gates 204. The subsequent figures show cross-sectional views along these cuts Y and X after particular fabrication operations.

FIGS. 3A-3M show a fabrication process for fabricating a semiconductor device 300 having a stacked transistor, a backside power distribution network (BSPDN), and connections to front power and signal lines. In particular, FIGS. 3A-3M show the semiconductor device 300 at various stages in the process, with each figure building on the previous figure. For example, FIG. 3B shows the semiconductor device 300 of FIG. 3A after subsequent fabrication operations have been performed, FIG. 3C shows the semiconductor device 200 of FIG. 3B after subsequent fabrication operations have been performed, and so on.

Furthermore, each figure shows two different regions associated with the two cuts discussed above. In particular, each figure has a cross-sectional view of the across-gate, or nanosheet, region (which follows cut X) shown on the left and a cross-section view of the source/drain epitaxy region (which follows cut Y) shown on the right.

Figure 3A:
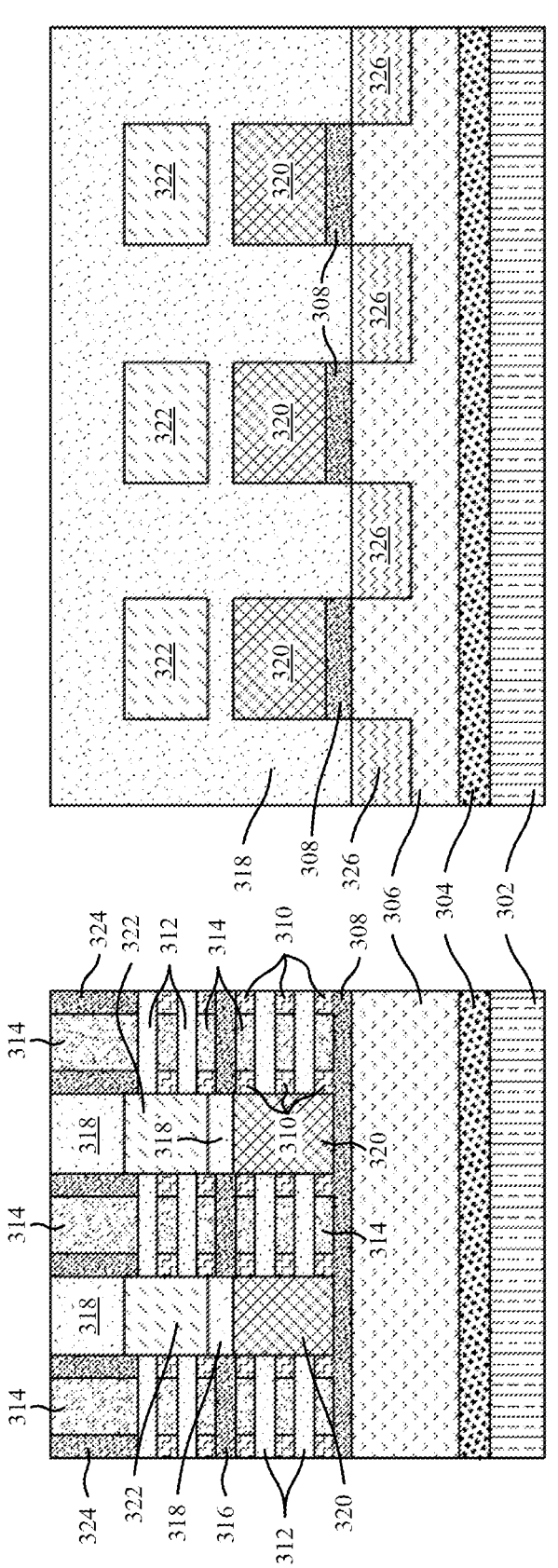
FIG. 3A illustrates a cross-sectional view of an example semiconductor device at an intermediate stage in the fabrication process, in accordance with embodiments of the present disclosure.
Figure 3B:
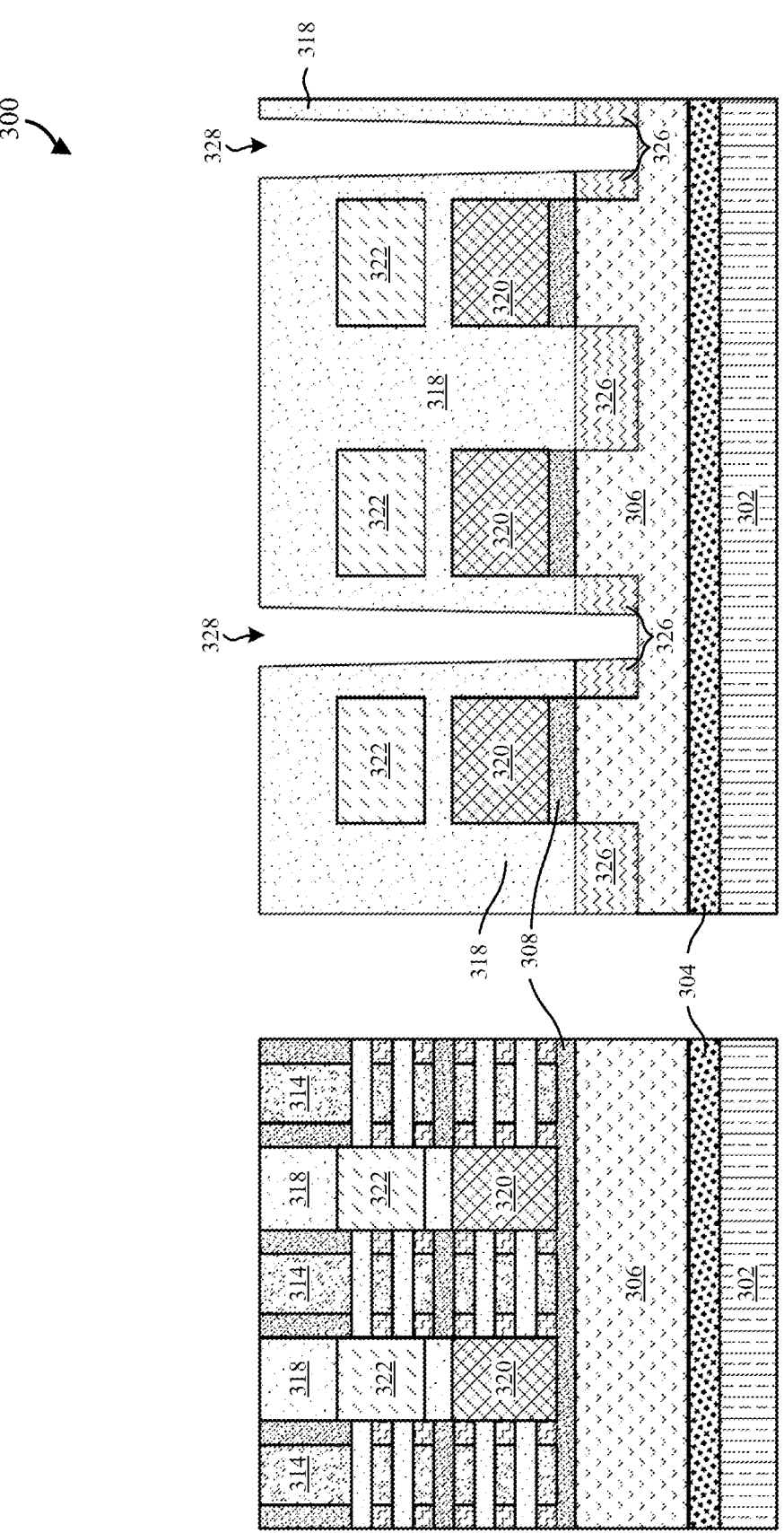
FIG. 3B illustrates a cross-sectional view of the example of the semiconductor device of FIG. 3A following the performance of additional fabrication operations, in accordance with embodiments of the present disclosure.
Figure 3C:
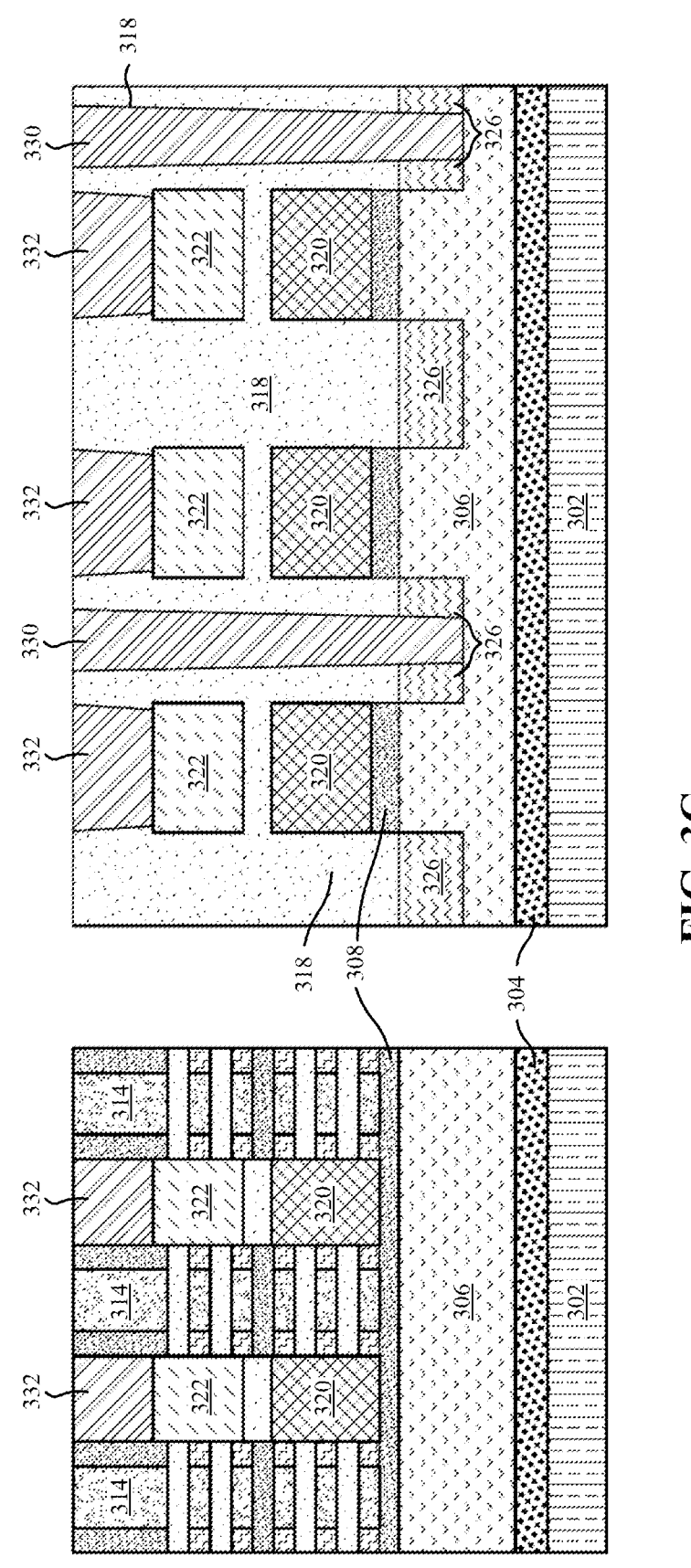
FIG. 3C illustrates a cross-sectional view of the example of the semiconductor device of FIG. 3B following the performance of additional fabrication operations, in accordance with embodiments of the present disclosure.

Referring now to FIG. 3A, illustrated is a cross-sectional view of an example semiconductor device 300 at an intermediate stage in the fabrication process, in accordance with embodiments of the present disclosure. In particular, FIG. 3A illustrates the semiconductor device 300 after the formation of a stacked FET source/drain and gate formation. Processes used to fabricate the stacked FET source/drain and gate, as shown in FIG. 3A, are well known to persons of ordinary skill in the art and are not within the scope of this disclosure. Accordingly, the specifics thereof have been omitted for brevity, and the semiconductor device 300 shown in FIG. 3A may be formed in any suitable manner.

The semiconductor device comprises a etch stop layer 304 deposited on top of a substrate 302. The etch stop layer may be, for example, $SiO_2$ or a SiGe such as, for example, SiGe 30%. The substrate may be, for example, a Si substrate. The etch stop layer 304 will act as an etch stop when removing the substrate 302 in subsequent fabrication operations. As such, in some embodiments, the etch stop layer 304 may be BOX $SiO_2$ if the starting wafer is a SOI wafer.

A semiconductor (e.g., Si) layer 306 (e.g., a Si epitaxy layer) is deposited on top of the etch stop layer 304. A bottom dielectric isolation (BDI) 308 is deposited on top of the Si layer 306. The BDI 308 may be made out of, for example, SiO2, SiOCN, SiOC, or SiBCN. The semiconductor device 300 further includes nanosheet transistor channels 312. The nanosheet transistor channels 312 may be made Si nanosheets. The nanosheet transistor channels 312 of a particular transistor are separated from each other by a high-k metal gate (HKMG) 314 and one or more inner spacers 310. The inner spacers 310 may be formed from a dielectric, such as SiO2, SiOCN, SiOC, or SiBCN. The HKMG 314 may be further located on top of the top nanosheet transistor channels 312, as shown in FIG. 3A.

The HKMG 314 includes the high-k dielectric such as HfO2, ZrO, HfLaOx, HfAlOx, etc., and a workfunction metal (WFM) such as TiN, TiC, TiAlC, TiAl, etc. and it may further comprise optional low resistance conducting metals such as W, Co and Ru. The work function metal can comprise a metal selected so as to have a specific work function appropriate for a given type FET (e.g., an N-type FET or a P-type FET). For example, for a silicon-based N-type FET, the work function metal can comprise hafnium, zirconium, titanium, tantalum, aluminum, or alloys thereof, such as hafnium carbide, zirconium carbide, titanium carbide, tantalum carbide, or aluminum carbide, so that the work function metal has a work function similar to that of N-doped polysilicon. For a silicon-based P-type FET, the work function metal can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the work function metal has a work function similar to that of P-doped polysilicon.

Furthermore, nanosheet transistor channels 312 of different transistors are separated by a spacer layer 316. For example, as shown in FIG. 3A, the semiconductor device 300 includes stacked transistors having a top transistor above a bottom transistor. The spacer layer 316 separates and electrically isolates the top and bottom transistors. The spacer layer 316 may be formed from a dielectric, such as SiO2, SiOCN, SiOC, or SiBCN.

The semiconductor device 300 further includes a plurality of bottom epitaxy regions 320 and a plurality of top epitaxy regions 322. The bottom epitaxy regions 320 are epitaxy regions for the bottom transistor(s) of the stacked transistor(s), while the top epitaxy regions 322 are the epitaxy regions for the top transistor(s) of the stacked transistor(s). The top and bottom epitaxy regions 320, 322 are formed in the regions between the channels 312.

An inter-layer dielectric (ILD) 318 separates the top and bottom epitaxies 320, 322 in the nanosheet region, as shown on the left side of FIG. 3A. The ILD 318 may be any suitable dielectric, including, for example, SiO2, SiOCN, SiOC, or SiBCN. In some embodiments, the ILD 318 may be made of the same material as one or both of the BDI 308 and the inner spacers 310. The ILD may also be deposited on top of the top source/drain epitaxy region 322. Additionally, as shown in the right side of FIG. 3A, the ILD 318 surrounds the top source/drain epitaxy 322 on all four side and surrounds the bottom source/drain epitaxy 320 on three sides in the source/drain region of the semiconductor device 300.

Furthermore, the semiconductor device 300 includes sidewall spacers 324 in the nanosheet region. The sidewall spacers 324 are disposed along the sides of the HKMG 314 above the top channel 312 of the top transistor(s) of the stacked transistor(s). The sidewall spacers may be made of any suitable dielectric, including, for example, SiO2, SiOCN, SiOC, or SiBCN. As shown in FIG. 3A, the sidewall spacers 324 may separate the top layer of the ILD 318 and a portion of the top epitaxy regions 322 from the HKMG 314.

As shown on the right in FIG. 3A, the semiconductor device 300 also includes shallow trench isolation (STI) regions 326 in the source/drain region. The STI regions 326 are formed in portions of the substrate semiconductor layer 306 that are lateral to the patterned stack. The STI regions 326 may prevent electric current leakage between the adjacent semiconductor components (e.g., between adjacent nanosheet FETs). In some embodiments, the STI regions 326 may be made of an oxide.

Referring now to FIG. 3B, top and bottom interlevel via trenches 328 are then formed in the semiconductor device 300 in the source/drain region. The top and bottom interlevel via trenches 328 are disposed lateral to the stacked transistors such that they are formed between different stacked transistors. In other words, the top and bottom interlevel via trenches 328 are located between cell boundaries of horizontally adjacent transistors. The top and bottom interlevel via trenches 328 extend from the top of the ILD 318 through the ILD 318, and through the STI regions 326, thereby exposing a portion of the semiconductor layer 306.

Middle-of-line (MOL) contacts and metallization is then performed. This is shown in FIG. 3C. In particular, interlevel vias 330 are formed in the top and bottom interlevel via trenches 328. Additionally, MOL contacts 332 are formed on top of the top source/drain epitaxy regions 322 in both the nanosheet region (shown on the left of FIG. 3C) and in the source/drain region (shown on the right of FIG. 3C). The interlevel vias 330 and MOL contacts 332 (also referred to as frontside contacts) are formed of any suitable conductive material and using any suitable fabrication process as would be known to persons of ordinary skill in the art. For example, the interlevel vias 330 and MOL contacts 332 can be formed using a silicide liner at bottom of the contact such as Ti, Ni, NiTi, NiPt, and a conductive metal such as Ru or W, or Co, with a thin adhesion metal liner such as TiN.

Figure 3D:
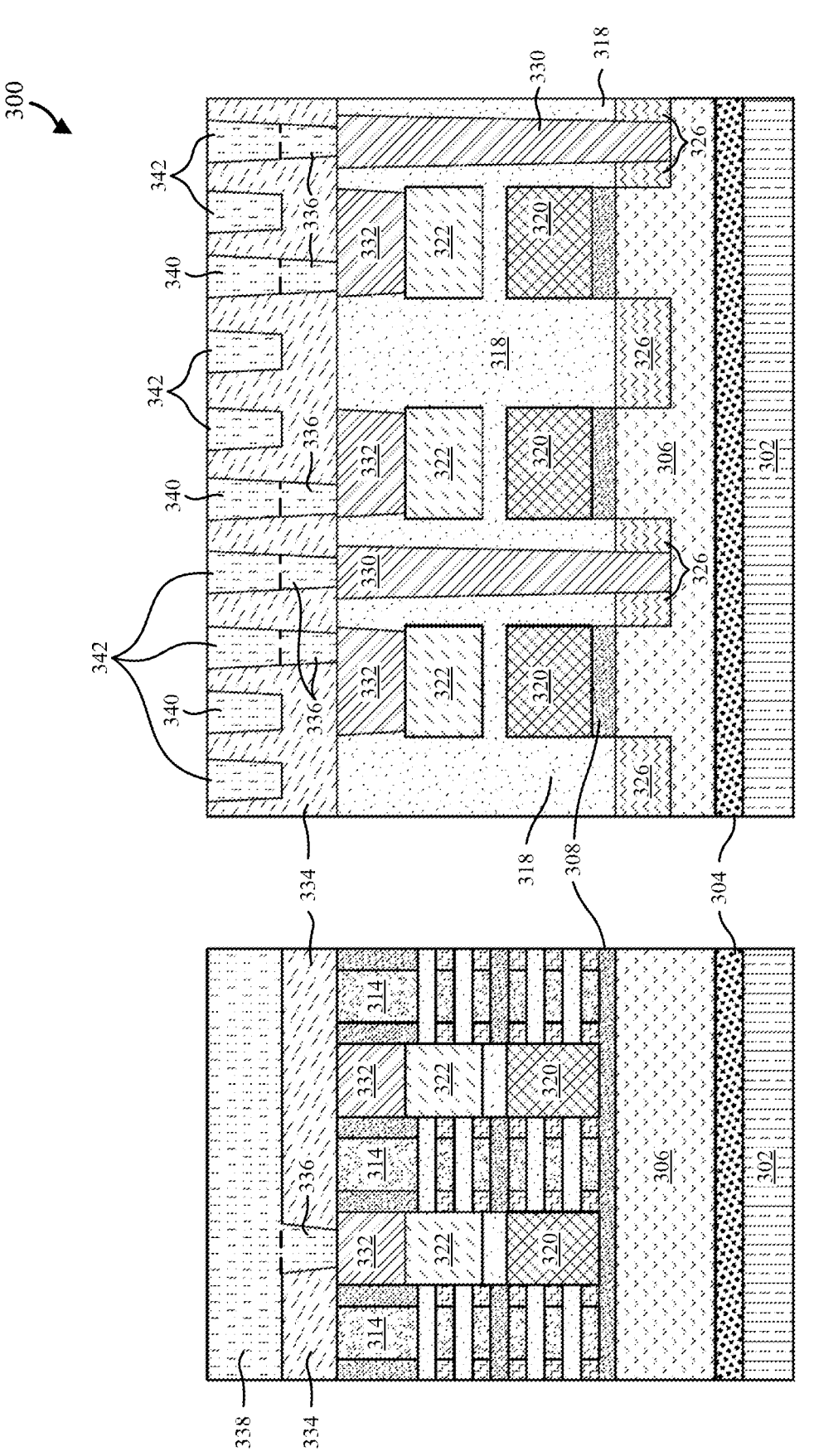
FIG. 3D illustrates a cross-sectional view of the example of the semiconductor device of FIG. 3C following the performance of additional fabrication operations, in accordance with embodiments of the present disclosure.

After forming the MOL structures, the frontside wiring is fabricated. This is shown in FIG. 3D. Forming the frontside wiring may include forming a frontside ILD 334 on top of the ILD 318, the MOL contacts 332, and the interlevel vias 330. The frontside ILD 334 may be made out of any suitable dielectric, as discussed herein. Additionally, frontside vias 336 are formed in the frontside ILD 334. The frontside vias 336 are electrically connected to either a MOL contact 332 or an interlevel via 330, as shown in FIG. 3D.

A power rail 338 (e.g., the M1 power rail), also referred to herein as a frontside power rail, is also formed in the nanosheet region of the semiconductor device 300. The power rail 338 is connect to at least one frontside via 336. In some embodiments, the power rail 338 is connected to multiple frontside vias 336, such as the frontside vias of other transistors that are not shown in the figure.

Furthermore, signal lines 342 and power lines 340 are formed in the frontside ILD 334. Some of the signal lines 342 and power lines 340 are formed on top of, and are electrically coupled to, a corresponding frontside via 336.

Other signal lines 342 and power lines 340 shown in FIG. 3D are not shown as being connected to a frontside via 336. This is because some of the power lines may connect to other transistors that are not shown in the figure.

The frontside vias 336, power rail 338, signal lines 342, and power lines 340 may be made of any suitable material and using any suitable fabrication process known to persons of ordinary skill. For example, the frontside vias 336, power rail 338, signal lines 342, and power lines 340 may formed using a silicide liner at bottom of the contact such as Ti, Ni, NiTi, NiPt, and a conductive metal such as Ru or W, or Co, with a thin adhesion metal liner such as TiN.

Figure 3E:
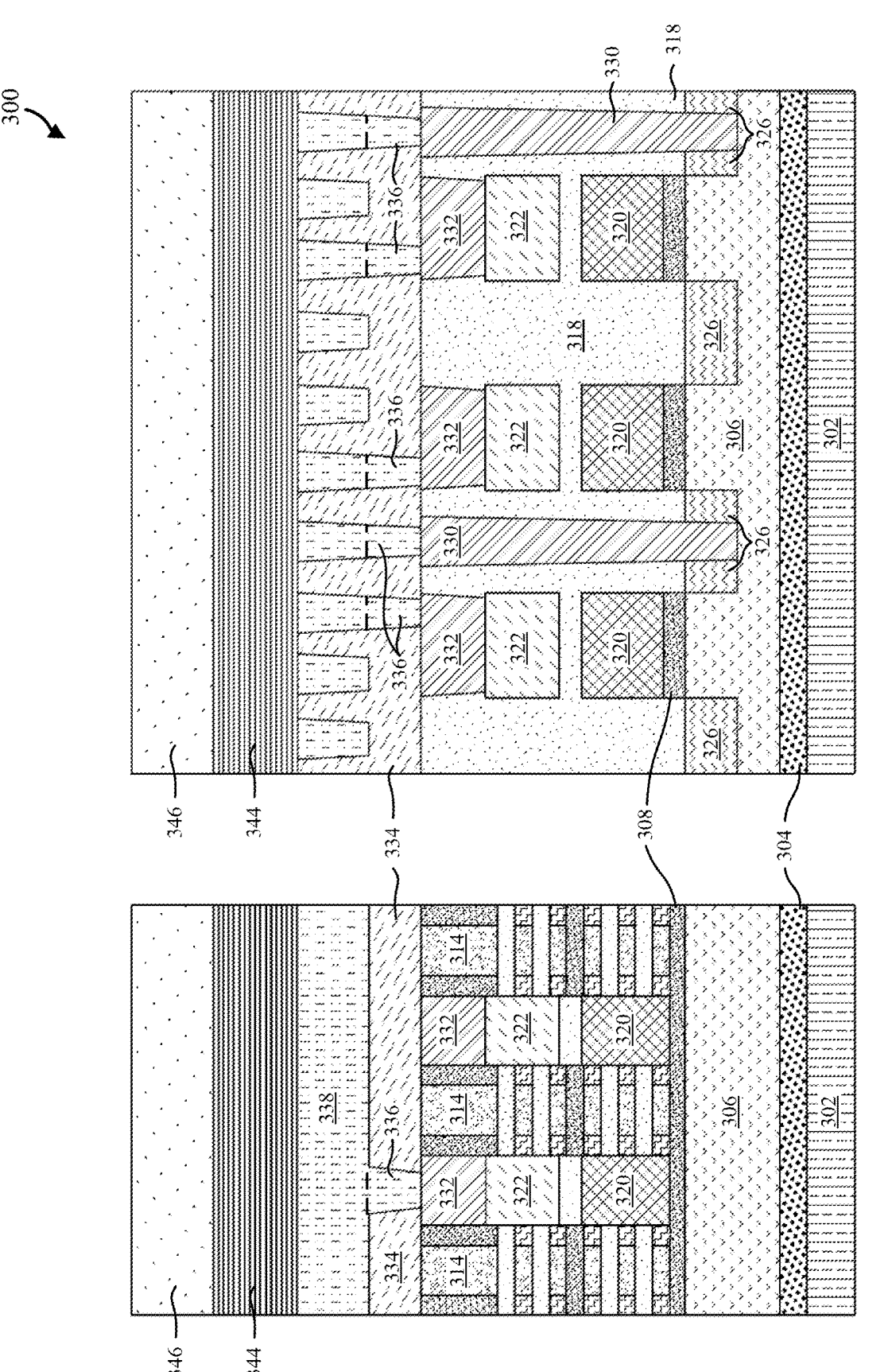
FIG. 3E illustrates a cross-sectional view of the example of the semiconductor device of FIG. 3D following the performance of additional fabrication operations, in accordance with embodiments of the present disclosure.

One or more back-end-of-line (BEOL) layers 344 are then formed on top of the frontside vias 336, power rail 338, signal lines 342, power lines 340, and topside ILD 334. This is shown in FIG. 3E. A carrier wafer 346 is then bonded to the BEOL layers 344 opposite the transistors.

It is to be understood that the dimensions of the MOL and BEOL 344 structures, as well as the carrier wafer 346, are not necessarily drawn to scale. The MOL and BEOL 344 structures and the carrier wafer 346 may be formed using any suitable processes, as would be recognized by a person of ordinary skill in the art. In some embodiments, BEOL 344 and carrier wafer 346 may be pre-fabricated and then bonded with the semiconductor device 300.

Figure 3F:
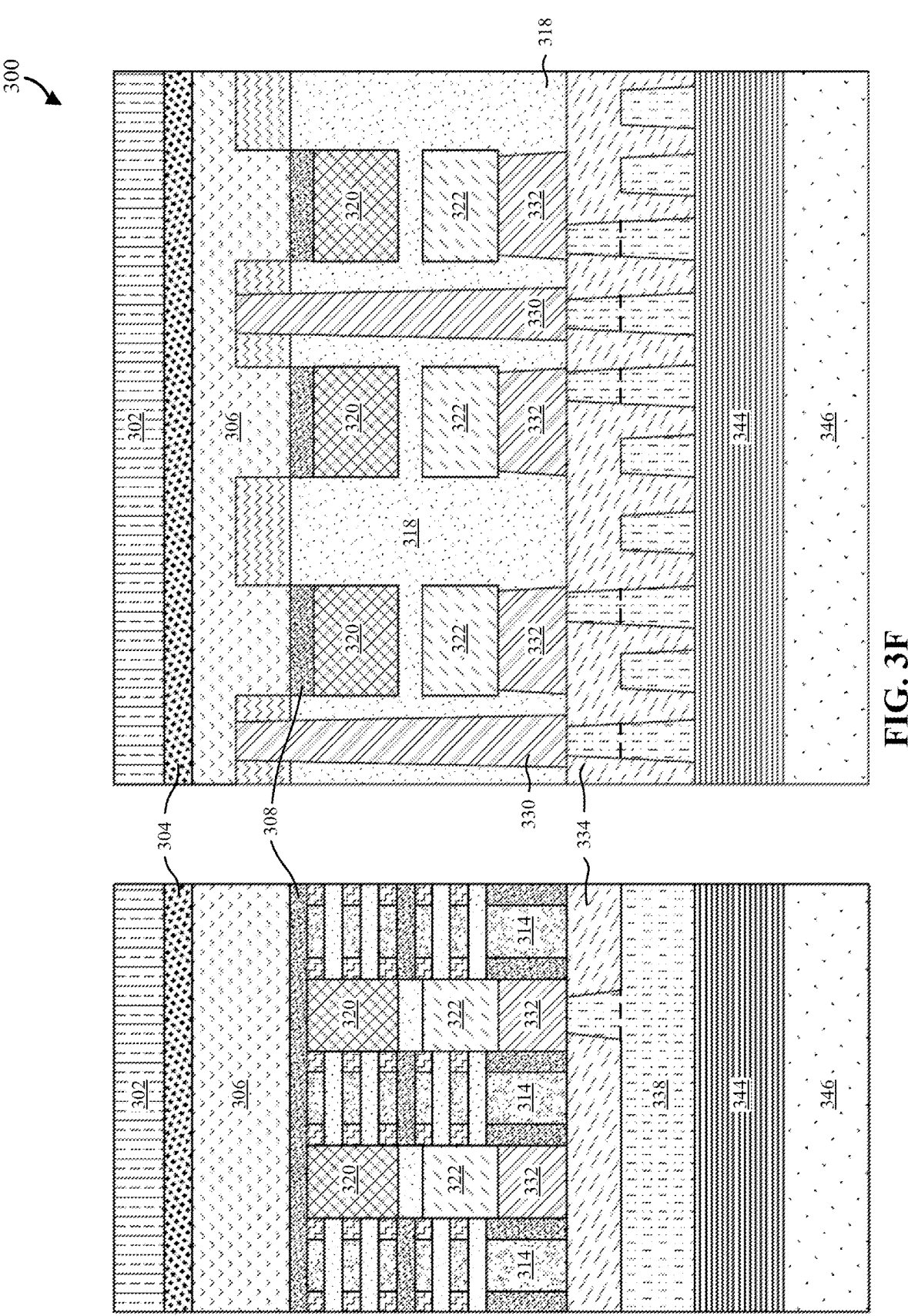
FIG. 3F illustrates a cross-sectional view of the example of the semiconductor device of FIG. 3E following the performance of additional fabrication operations, in accordance with embodiments of the present disclosure.
Figure 3G:
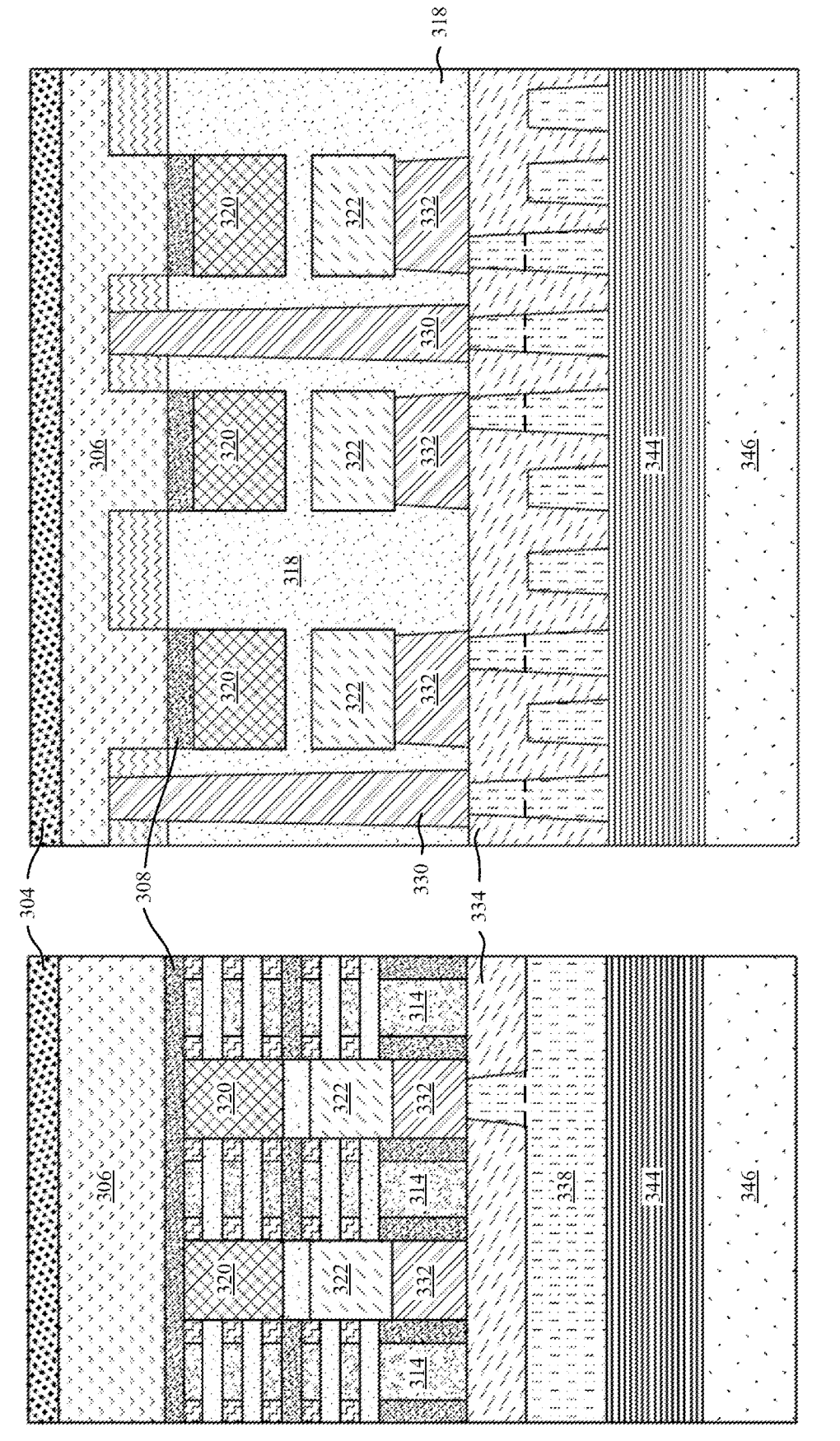
FIG. 3G illustrates a cross-sectional view of the example of the semiconductor device of FIG. 3F following the performance of additional fabrication operations, in accordance with embodiments of the present disclosure.

Next, the wafer is flipped. This is shown in FIG. 3F. After flipping the wafer, the substrate 302 is removed. This is shown in FIG. 3G. The substrate 302 may be removed through substrate grinding, CMP and a selective etching process that stops on the etch stop layer 304.

Figure 3H:
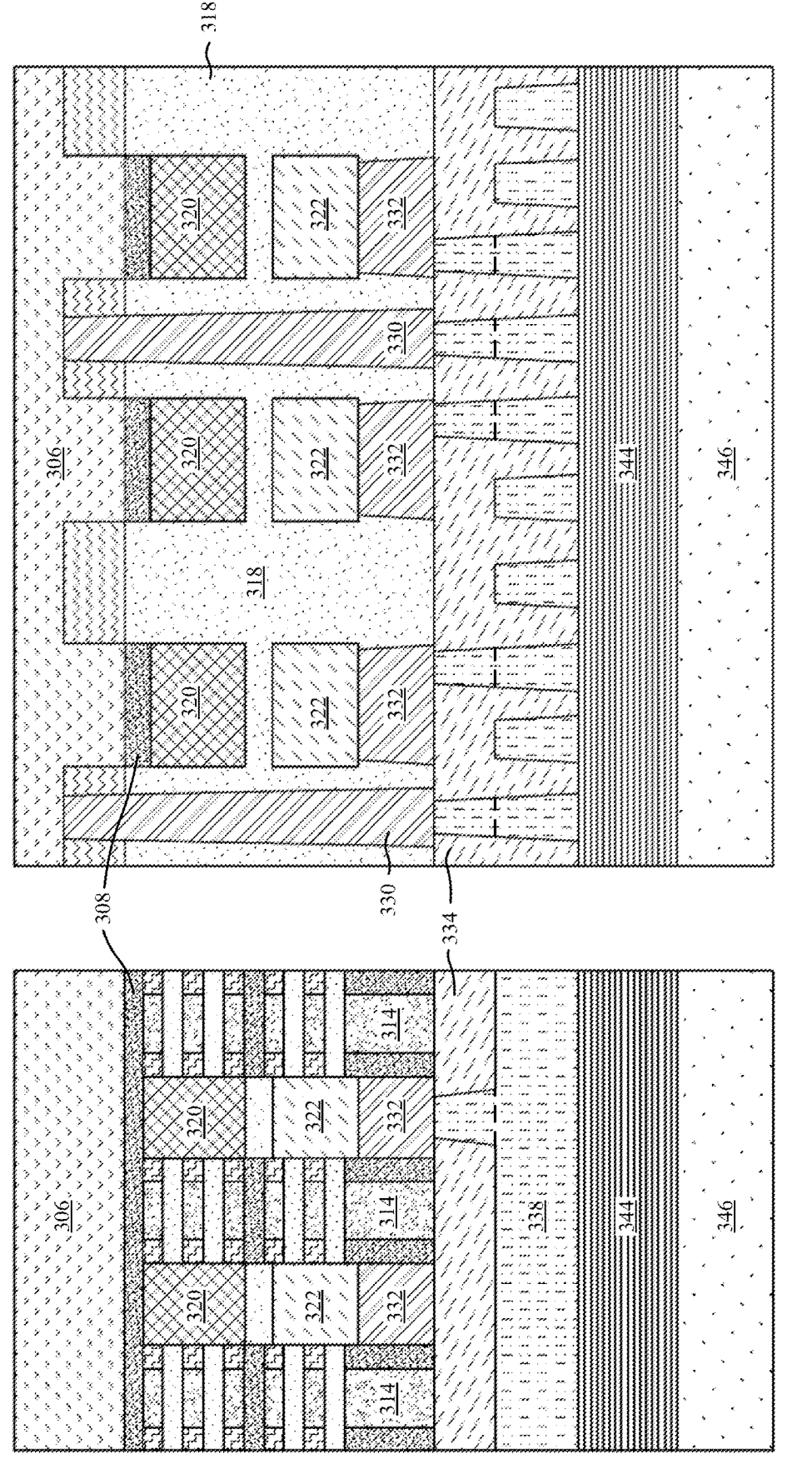
FIG. 3H illustrates a cross-sectional view of the example of the semiconductor device of FIG. 3G following the performance of additional fabrication operations, in accordance with embodiments of the present disclosure.
Figure 3I:
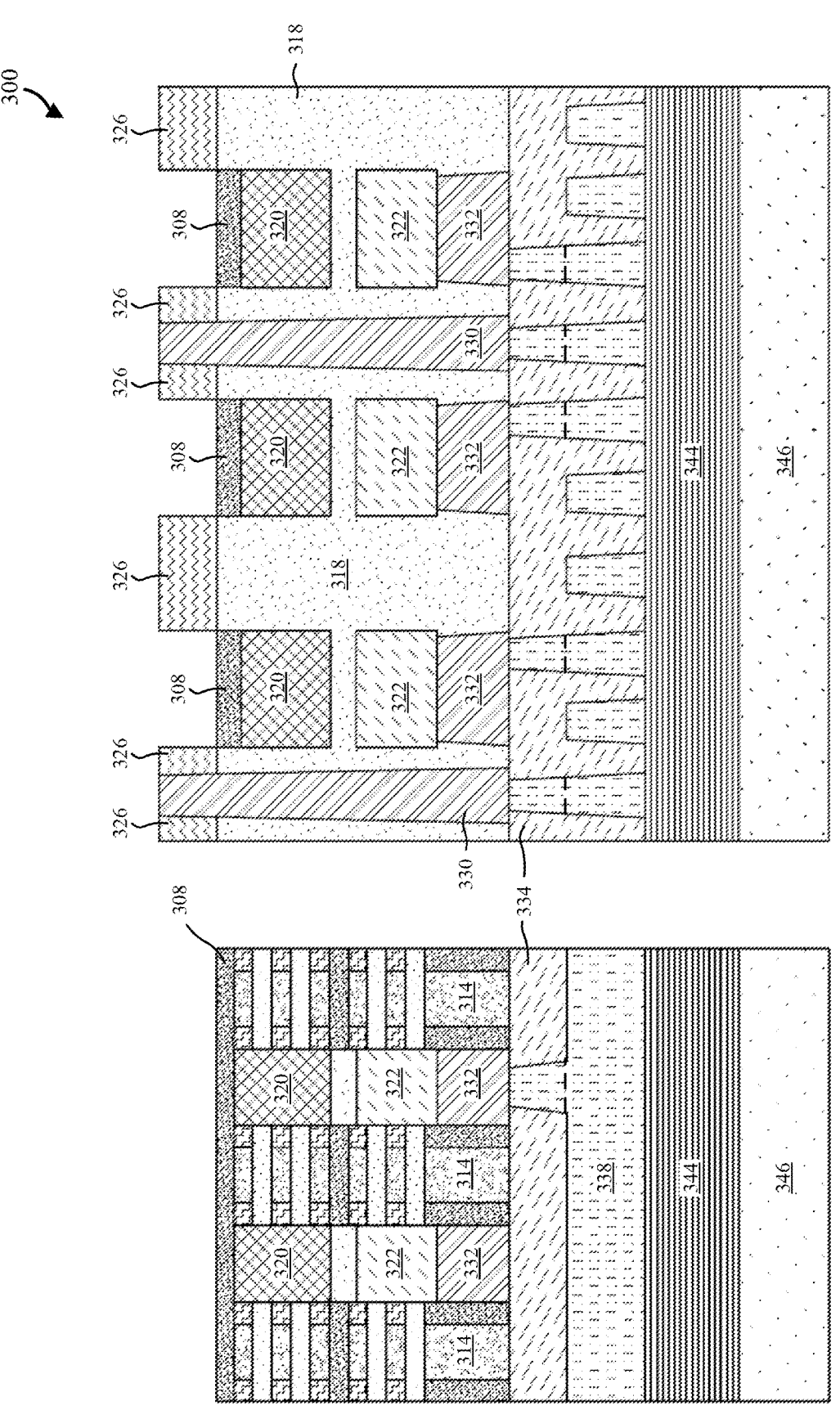
FIG. 3I illustrates a cross-sectional view of the example of the semiconductor device of FIG. 3H following the performance of additional fabrication operations, in accordance with embodiments of the present disclosure.

Next, a selective etching process may be performed to selectively remove the etch stop layer 304 with respect to semiconductor layer 306. This is shown in FIG. 3H. The semiconductor layer 306 is then removed selective to BDI 308, STI regions 326, and the interlevel via 330. This is shown in FIG. 3I. Selective removal of the semiconductor layer 306 exposes the STI regions 326 and the bottoms of the interlevel vias 330.

Figure 3J:
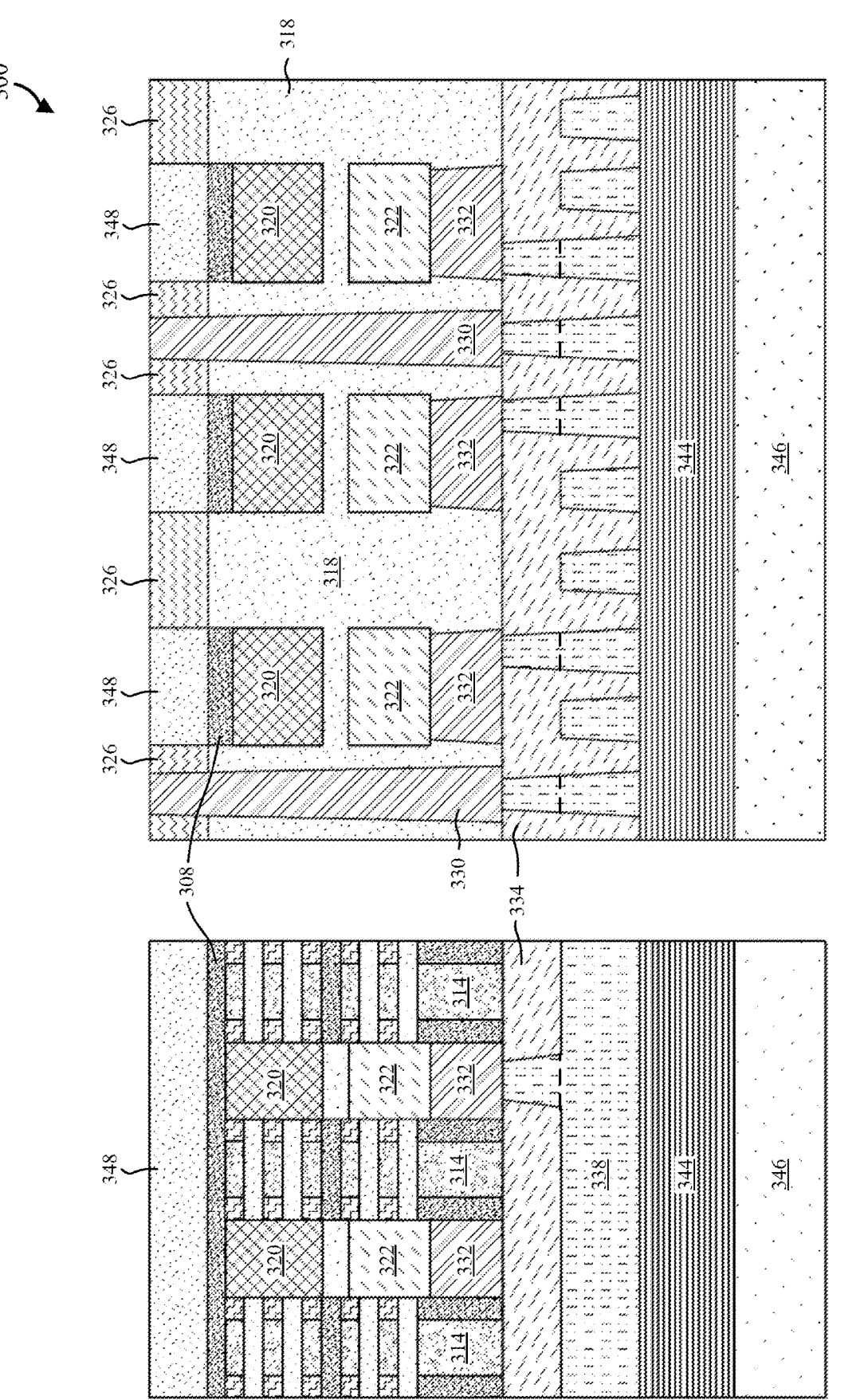
FIG. 3J illustrates a cross-sectional view of the example of the semiconductor device of FIG. 3I following the performance of additional fabrication operations, in accordance with embodiments of the present disclosure.

Next, a backside ILD fill process and CMP process may be performed. This is shown in FIG. 3J. The backside ILD 348 may be deposited on top of the BDI 308 and between the STI regions 326. The CMP process may then planarize the top of the semiconductor device 300 such that the bottom of the backside ILD 348 is coplanar with the bottom of the STI regions 326 and the bottom of the interlevel vias 330.

Figure 3K:
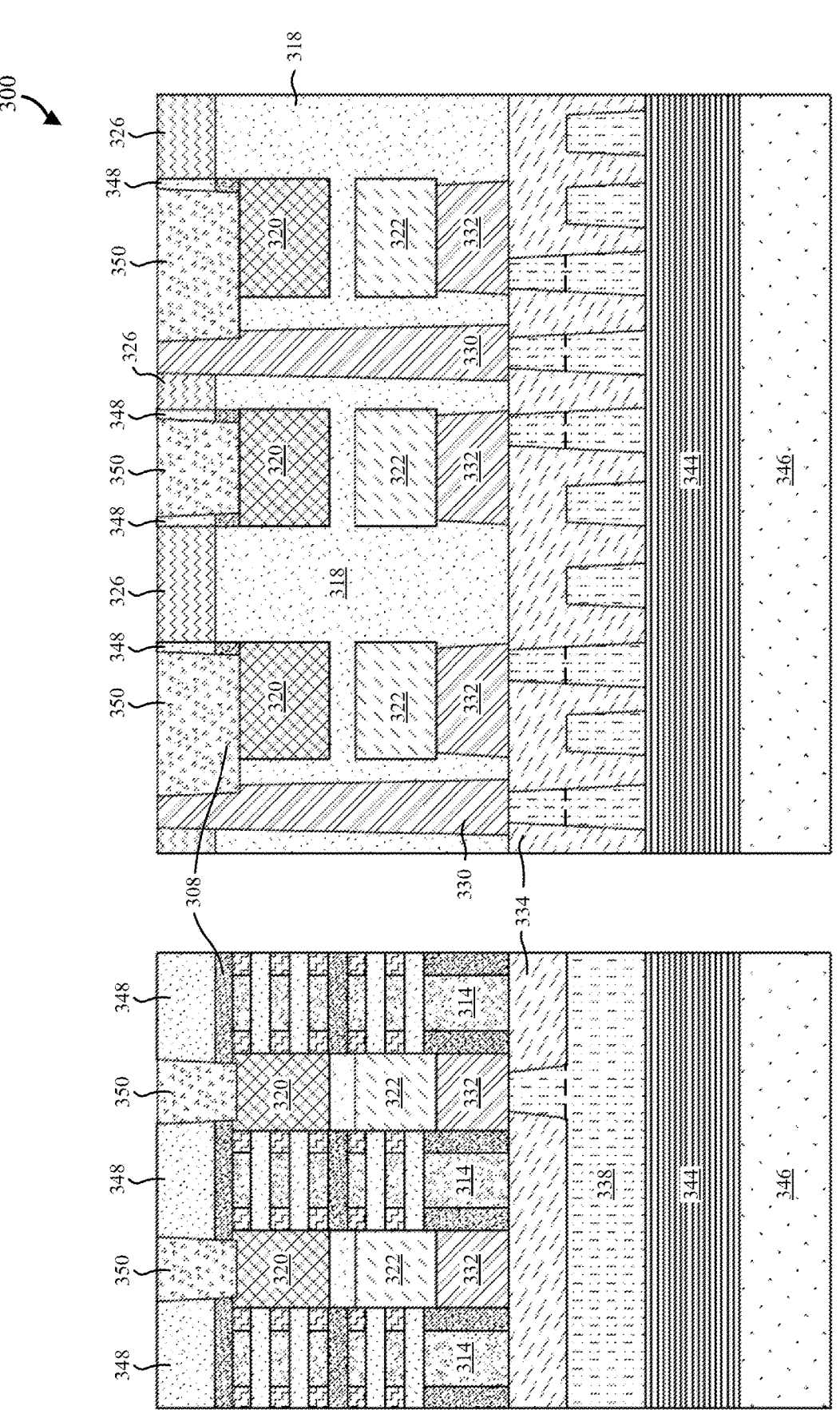
FIG. 3K illustrates a cross-sectional view of the example of the semiconductor device of FIG. 3J following the performance of additional fabrication operations, in accordance with embodiments of the present disclosure.

Backside contact patterning may then be performed. This is shown in FIG. 3K. In particular, trenches may be patterned through the backside ILD 348 and into the bottom epitaxy regions 320 in areas where backside contacts are to be formed. Portions of the STI regions 326, such as those alongside the interlevel vias 330, may also be removed by this process. This process allows for much better tolerance in the critical dimensions (CD) and overlay when compared to traditional processes.

Next, a precontact clean may be performed. Following the precontact clean, backside contacts 350 are formed in the trenches. The backside contacts 350 may be formed of any suitable conductive material such as, a silicide liner at bottom of the contact such as Ti, Ni, NiTi, NiPt, and conductive metal such as Ru or W, or Co, with a thin adhesion metal liner such as TiN. Some of the backside contacts 350 may interconnect an interlevel via 330 with a bottom source/drain epitaxy 320, as shown in FIG. 3K. Meanwhile, other backside contacts 350 may only be formed on top of a bottom source/drain epitaxy 320, as shown in the nanosheet region (on the left) and the middle of the source/drain region (on the right) in FIG. 3K.

Figure 3L:
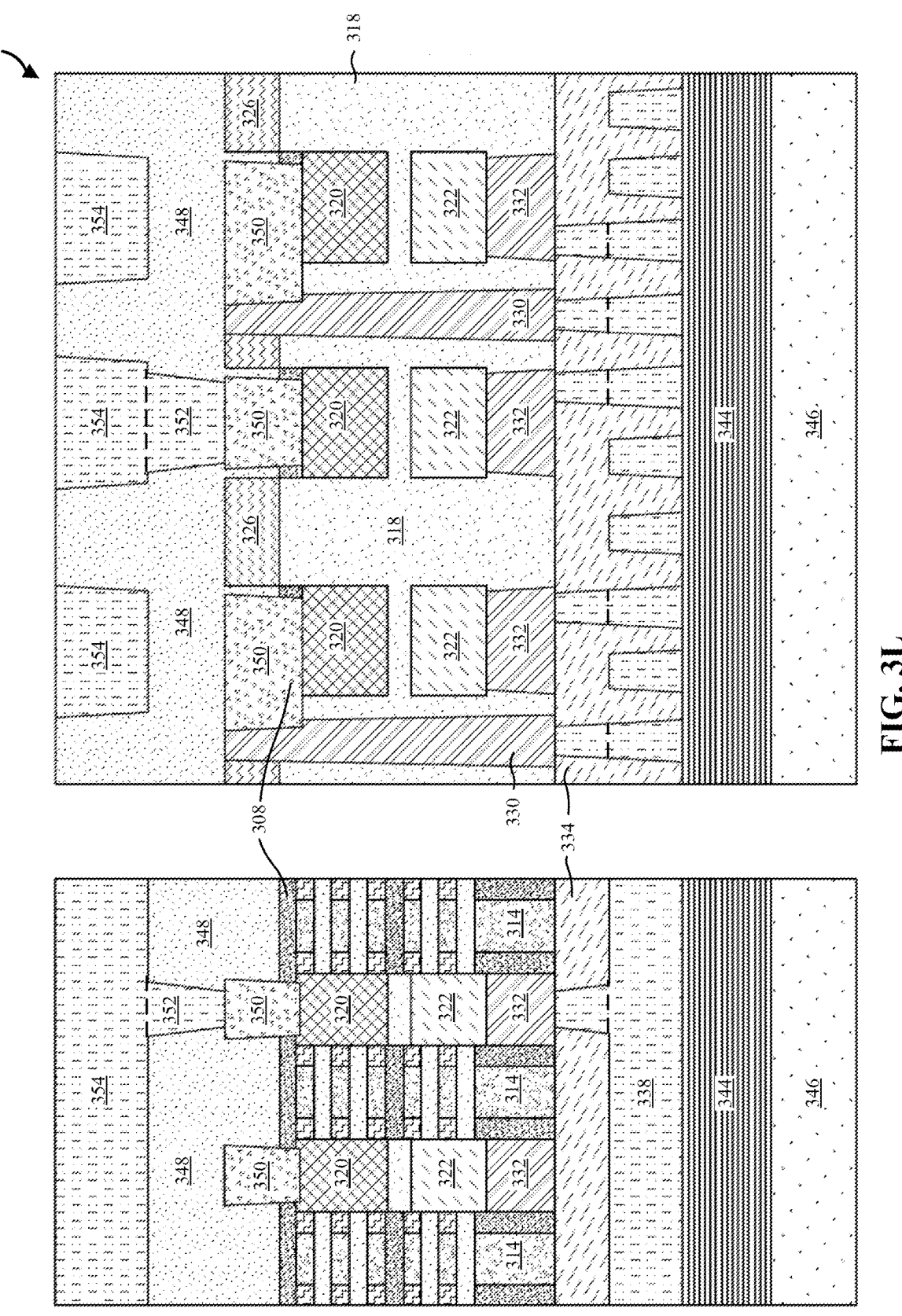
FIG. 3L illustrates a cross-sectional view of the example of the semiconductor device of FIG. 3K following the performance of additional fabrication operations, in accordance with embodiments of the present disclosure.

After forming the backside contacts 350, the backside via(s) 352 and power rail(s) 354 are formed. This is shown in FIG. 3L. Forming the backside via(s) 352 and power rail(s) may include first depositing additional ILD material to increase the size of the backside ILD 348. Next, backside vias 352 may be formed in the backside ILD 348. The backside vias 352 are formed above backside contacts 350 that are going to be connected to the backside power rails 354. Next, the backside power rails 354 are formed in the backside ILD 348. The backside power rails 354 and the backside vias 352 may be formed using any suitable materials and fabrication processes recognized by persons of ordinary skill in the art. For example, the backside power rails 354 and the backside vias 352 may be formed of any suitable conductive material such as, such as Cu, Ru or W, or Co, with a thin adhesion metal liner such as TiN, using a series of masking, etching, and deposition processes.

Figure 3M:
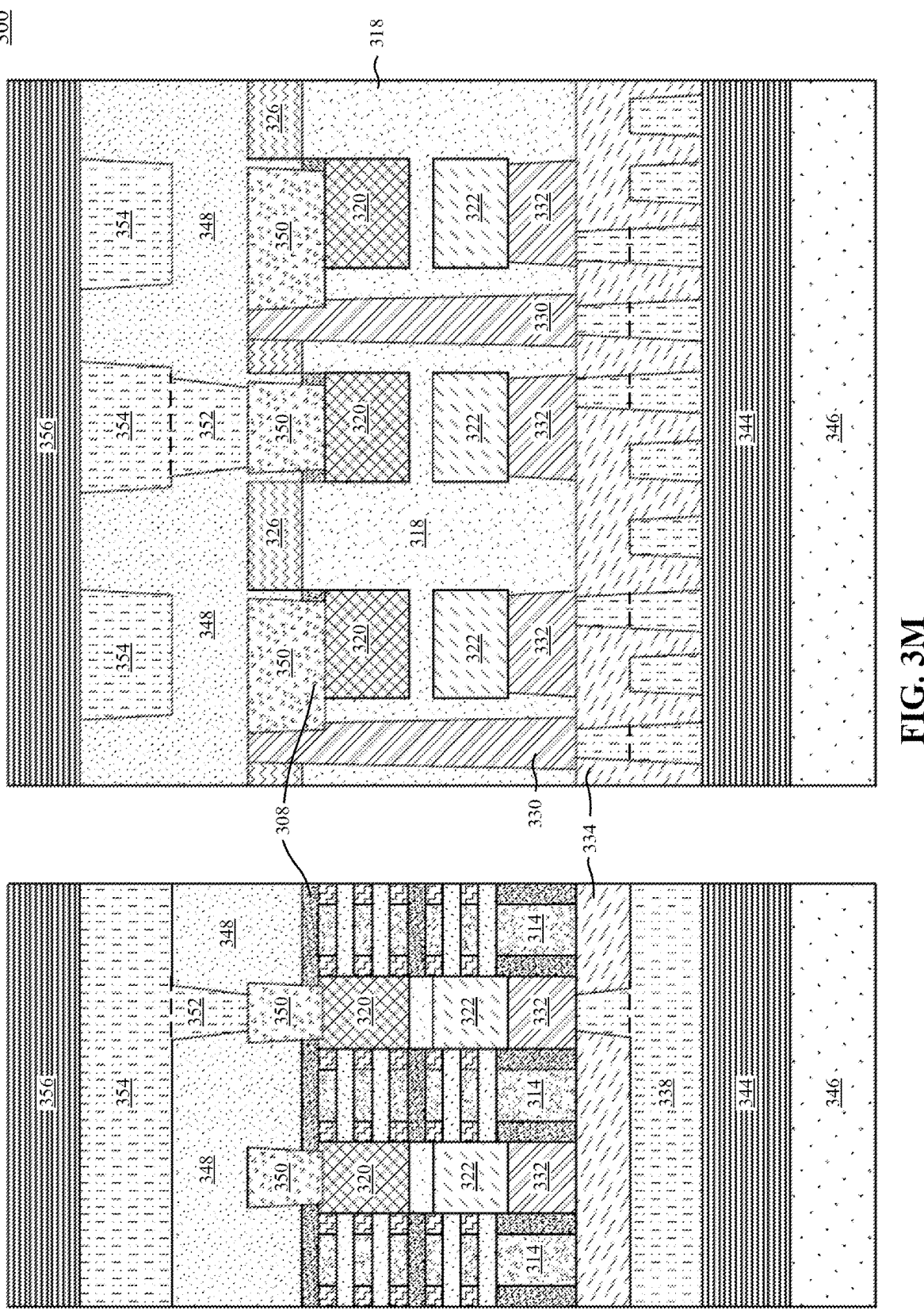
FIG. 3M illustrates a cross-sectional view of the example of the semiconductor device of FIG. 3L following the performance of additional fabrication operations, in accordance with embodiments of the present disclosure.

Finally, a BSPDN 356 is then formed on top of the backside power rails 354. This is shown in FIG. 3M. In the semiconductor device 300 shown in FIG. 3M, the BSPDN 356 may provide power to the bottom transistors of the stacked transistors through the backside power rails 354, backside vias 352, and backside contacts 350. Meanwhile the top transistors may receive power from the frontside power rail 338 using the frontside vias 336. Similarly, both the bottom and top transistors may be connected to the signal lines 342 through frontside vias 336. In the case of the bottom transistors, the frontside vias 336 that connect to the signal lines 342 also connect to the interlevel vias 330, which themselves connect to backside contacts 350, in order to provide the signal to the bottom source/drain epitaxies 320.

It is to be understood that the aforementioned advantages are example advantages and should not be construed as limiting. Embodiments of the present disclosure can contain all, some, or none of the aforementioned advantages while remaining within the spirit and scope of the present disclosure.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description It should also be understood that material compounds will be described in terms of listed elements, e.g., SiN, SiCN, SiCO, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

As discussed herein, embodiments of the present disclosure include a method. The method may be performed by, for example, a computer system that control semiconductor fabrication machinery. As such, the method may be embodied as a computer program product having software instructions on a storage medium. The computer program product may include a computer readable storage medium (or media) having computer readable program instructions thereon for causing a processor to carry out aspects of the present invention.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c)

or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a first transistor stacked on top of a second transistor;

a frontside power rail that is electrically coupled to a source/drain epitaxy of the first transistor;
a backside power rail that is electrically coupled to a source/drain epitaxy of the second transistor; and
a plurality of frontside signal lines, wherein a first frontside signal line is electrically coupled to the source/drain epitaxy of the second transistor through a backside contact and an interlevel via, wherein the interlevel via is located between cell boundaries of horizontally adjacent transistors.

2. The semiconductor device of claim 1, further comprising:
a middle-of-line structure (MOL); and
one or more MOL contacts,
wherein the interlevel via and the one or more MOL contacts have approximately a same taper angles.

3. The semiconductor device of claim 1, wherein the first frontside signal line is connected to the source/drain epitaxy of the second transistor through a frontside via that connects the first frontside signal line to the interlevel via.

4. The semiconductor device of claim 1, further comprising:
a second frontside signal line that is connected to a source/drain epitaxy of the first transistor through a frontside contact and frontside via.

5. The semiconductor device of claim 1, wherein the frontside power rail is connected to the source/drain epitaxy of the first transistor through a frontside via.

6. The semiconductor device of claim 1, wherein the backside power rail is connected to the source/drain epitaxy of the second transistor through a backside via.

7. The semiconductor device of claim 5, wherein first and second transistors are connected to create a complementary metal-oxide semiconductor (CMOS) cell.

8. The semiconductor device of claim 6, wherein the first and second transistors form a complementary field-effect transistor (CFET).

9. The semiconductor device of claim 1, further comprising a backside power distribution network (BSPDN) connected to the backside power rail opposite the first and second transistors.

10. The semiconductor device of claim 1, wherein the first and second transistors are nanosheet transistors.

11. A semiconductor device comprising:
a stacked transistor comprising:
a bottom transistor having one or more bottom source/drain epitaxy regions; and
a top transistor having one or more top source/drain epitaxy regions; and
a plurality of frontside signal lines,
wherein a bottom source/drain epitaxy region is connected to a first frontside signal line though an interlevel via that is located between cell boundaries of the stacked transistor and an adjacent device.

12. The semiconductor device of claim 11, wherein the interlevel via is connected to the bottom source/drain epitaxy region through a backside contact.

13. The semiconductor device of claim 12, wherein the interlevel via is connected to the first signal line through a frontside via.

14. The semiconductor device of claim 12, wherein a top source/drain epitaxy region is connected to a second frontside signal line though a second frontside via.

15. The semiconductor device of claim 11, further comprising:
a backside power distribution network (BSPDN) located below the bottom transistor; and a backside power rail electrically connected to the BSPDN, the backside power rail being located between the BSPDN and the bottom transistor, wherein a bottom source/drain epitaxy region of the bottom transistor is connected to the backside power rail through a backside via and a backside contact, the backside contact connecting the backside via to the backside power rail.

16. A method for fabricating a semiconductor device, the method comprising:

forming a stacked FET, the stacked FET including a top transistor with at least two top source/drain epitaxies and a bottom transistor with at least two bottom source/ drain epitaxies;

forming one or more middle-of-line (MOL) structures;

forming one or more frontside contacts and frontside vias to wire a first top source/drain epitaxy to a frontside power rail and a second top source/drain epitaxy to a signal line;

forming one or more BEOL layers; and forming one or more backside contacts below the bottom source/drain epitaxies, wherein:

at least one backside contact connects a bottom source/ drain epitaxy to a first MOL structure, and at least one backside contact connects a bottom source/ drain epitaxy to a backside power rail through a backside via wherein the first MOL structure includes an interlevel via that is formed lateral to the stacked FET.

17. The method of claim 16, further comprising, after forming the one or more BEOL layers and before forming the one or more backside contacts:

bonding a carrier wafer to the one or more BEOL layers;

flipping the semiconductor device; and removing a substrate from the semiconductor device.

18. The method of claim 17, wherein removing the substrate comprises:

removing a first portion of the substrate, selective to an embedded etch stop layer;

removing the etch stop layer; and removing a second portion of the substrate.

* * * * *